(12) United States Patent
Cunningham et al.

(10) Patent No.: US 9,142,698 B1
(45) Date of Patent: Sep. 22, 2015

(54) INTEGRATED ELECTRO-ABSORPTION MODULATOR

(71) Applicant: Oracle International Corporation, Redwood City, CA (US)

(72) Inventors: John E. Cunningham, San Diego, CA (US); Jin Yao, San Diego, CA (US); Ivan Shubin, San Diego, CA (US); Guoliang Li, San Diego, CA (US); Xuezhe Zheng, San Diego, CA (US); Shiyun Lin, San Diego, CA (US); Hiren D. Thacker, San Diego, CA (US); Stevan S. Djordjevic, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/252,607

(22) Filed: Apr. 14, 2014

(51) Int. Cl.
*H01L 31/18* (2006.01)
*H01L 31/0232* (2014.01)

(52) U.S. Cl.
CPC ............... *H01L 31/02327* (2013.01)

(58) Field of Classification Search
USPC ............................................. 257/18
See application file for complete search history.

(56) References Cited

U.S. PATENT DOCUMENTS

| | | | |
|---|---|---|---|
| 4,005,927 A * | 2/1977 | Caton | 385/8 |
| 8,160,404 B2 * | 4/2012 | Pan et al. | 385/2 |
| 2008/0193076 A1 * | 8/2008 | Witzens et al. | 385/14 |

* cited by examiner

*Primary Examiner* — Thao P Le
(74) *Attorney, Agent, or Firm* — Park, Vaughan, Fleming & Dowler LLP; Steven E. Stupp

(57) ABSTRACT

An integrated optical device includes an electro-absorption modulator disposed on a top surface of an optical waveguide. The electro-absorption modulator includes germanium disposed in a cavity between an n-type doped silicon sidewall and a p-type doped silicon sidewall. By applying a voltage between the n-type doped silicon sidewall and the p-type doped silicon sidewall, an electric field can be generated in a plane of the optical waveguide, but perpendicular to a propagation direction of the optical signal. This electric field shifts a band gap of the germanium, thereby modulating the optical signal.

19 Claims, 7 Drawing Sheets

INTEGRATED ELECTRO-ABSORPTION MODULATOR

GOVERNMENT LICENSE RIGHTS

This invention was made with United States government support under Agreement No. HR0011-08-9-0001 awarded by DARPA. The United States government has certain rights in the invention.

BACKGROUND

1. Field

The present disclosure relates to techniques for modulating optical signals. More specifically, the present disclosure relates to an integrated optical device that includes an electro-absorption modulator.

2. Related Art

Silicon photonics is a promising technology that can provide large communication bandwidth, low latency and low power consumption for inter-chip and intra-chip optical interconnects or links. A key component for use in inter-chip and intra-chip optical interconnects is a modulator that can be monolithically integrated into the same silicon layer as transistors and other optical components.

Some approaches for implementing silicon-photonic modulators are based on germanium, which is an efficient absorbing material at infrared wavelengths that include a 1.5 μm band for electro-absorptive modulator applications. For example, for high-performance transistors, a silicon layer can either be strained by the addition of germanium layers or used as a direct, mobility-enhanced silicon-germanium layer.

Consequently, there is considerable interest in integrating alloys of germanium on silicon from both an optical and an electronic perspective. In existing fabrication techniques, germanium alloys are typically produced by direct heteroepitaxial integration using crystal growth at the wafer level. For this reason, germanium is available in many front-end CMOS manufacturing lines and opportunistically provides a manufacturing path for making an electro-absorptive modulator on silicon.

Several approaches have been proposed for making germanium-based modulators that are monolithically integrated on silicon. In some approaches, an silicon-on-insulator (SOI) substrate is used to provide strong confinement of light for optical-waveguide applications in conjunction with germanium integration. The use of a SOI substrate can also be used to fabricate a plurality of wavelength-division-multiplexing optical components to further increase optical communication bandwidth.

Moreover, direct heteroepitaxial integration has been reported for germanium quantum wells and silicon-germanium alloys in surface-normal geometries on bulk silicon substrates to produce quantum-confined Stark effect (QCSE) and Franz-Keldysh (FK) electro-absorption modulators. In principle, electro-absorption modulators, with their wide spectral range of modulation-bandwidth operation, may allow reduced tuning power to be used when aligning the electro-absorption modulators with other optical components in optical links. However, in practice a surface-normal device geometry often requires thick active layers (in order for the light to interact with the silicon-germanium layer). Therefore, very high voltage is typically needed during operation of these optical devices. Furthermore, these optical devices usually are not compatible with the in-plane, edge geometries that are typically used for optical-waveguide operation.

Integrating such a vertical profile on an SOI substrate remains an active area of research. For example, attempts at integrating in-plane FK and QCSE electro-absorption modulators in optical waveguides on SOI substrates are typically complicated and usually have poor performance.

Hence, what is needed is an integrated electro-absorption modulator without the above-described problems.

SUMMARY

One embodiment of the present disclosure provides an optical device. This optical device includes an optical waveguide, having a top surface, which conveys an optical signal having a wavelength along a propagation direction. Moreover, the optical device includes an electro-absorption modulator disposed on the top surface. The electro-absorption modulator includes: an n-type doped silicon sidewall; a p-type doped silicon sidewall; germanium disposed between the n-type doped silicon sidewall and the p-type doped silicon sidewall; and electrical contacts electrically coupled to the n-type doped silicon sidewall and the p-type doped silicon sidewall. The electrical contacts apply a voltage between the n-type doped silicon sidewall and the p-type doped silicon sidewall to generate an electric field along a lateral direction in the germanium, where the lateral direction is parallel to a plane of the optical waveguide and is perpendicular to the propagation direction.

Note that the n-type doped silicon sidewall and the p-type doped silicon sidewall may be included in a ring of silicon. This ring of silicon may include a cavity defined by an edge, and the germanium may be disposed in the cavity.

In some embodiments, the optical device includes inverse optical tapers defined in the germanium, where the inverse optical tapers control a spatial extent of an optical mode in the germanium. The inverse optical tapers may include doped regions in the germanium.

Moreover, the germanium may have a thickness between 300 and 600 nm.

Furthermore, the optical waveguide may include mirrors on either side of the electro-absorption modulator. For example, the mirrors may include distributed Bragg gratings.

Additionally, the optical device may include: a substrate; a buried-oxide layer disposed on the substrate; and a semiconductor layer disposed on the buried-oxide layer, where the optical waveguide is included in the semiconductor layer. Note that the substrate may include a semiconductor. Thus, the substrate, the buried-oxide layer and the semiconductor layer may comprise a silicon-on-insulator technology.

Another embodiment provides a system that includes the optical device.

Another embodiment provides a method for modulating an optical signal, which may be performed by the optical device. During operation, the optical device conveys the optical signal in the optical waveguide in the propagation direction. Then, the optical device applies the voltage to the n-type doped silicon sidewall and the p-type doped silicon sidewall in the electro-absorption modulator disposed on top of the optical waveguide, where the voltage generates the lateral electric field in the germanium between the n-type doped silicon sidewall and the p-type doped silicon sidewall. Note that the lateral electric field is parallel to the plane of the optical waveguide and is perpendicular to the propagation direction.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
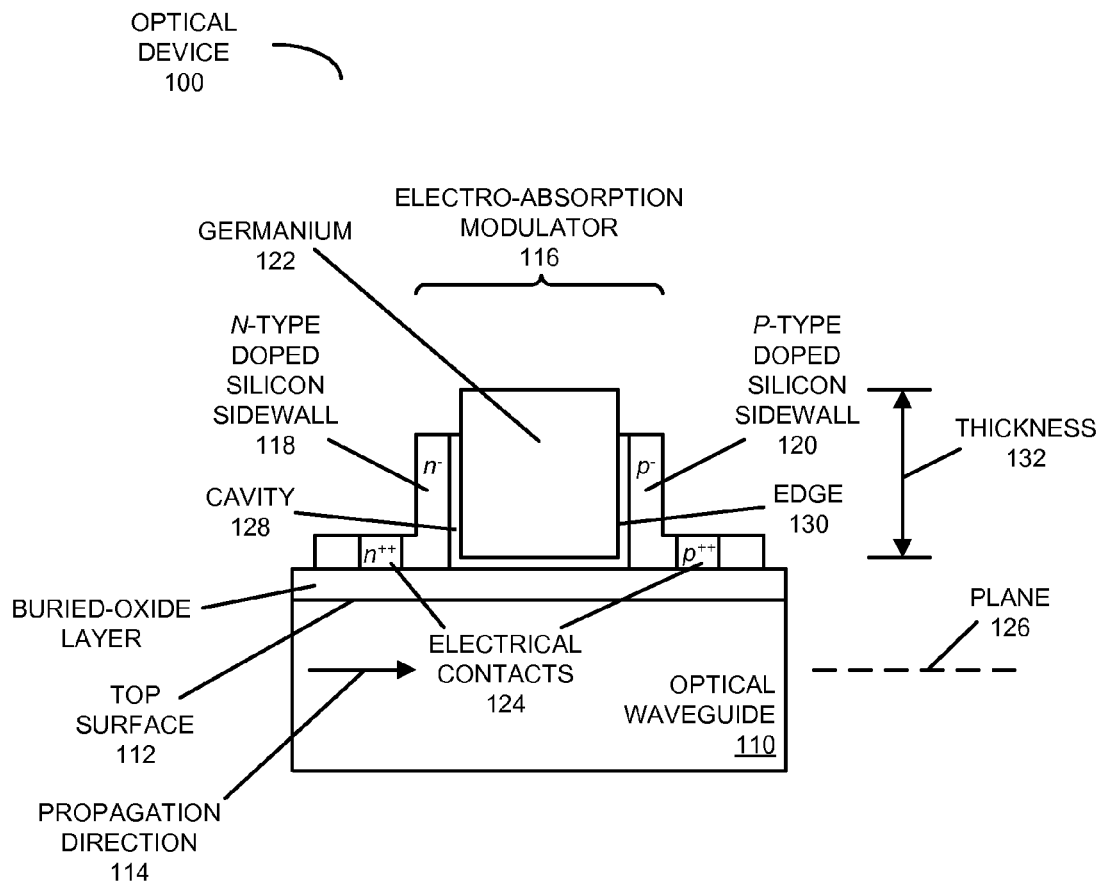
FIG. 1 is a block diagram illustrating a side view of an optical device in accordance with an embodiment of the present disclosure.

Embodiments of an optical device, a system that includes the optical device, and a method for modulating an optical signal are described. This integrated optical device includes an electro-absorption modulator disposed on a top surface of an optical waveguide. The electro-absorption modulator includes germanium disposed in a cavity between an n-type doped silicon sidewall and a p-type doped silicon sidewall. By applying a voltage between the n-type doped silicon sidewall and the p-type doped silicon sidewall, an electric field can be generated in a plane of the optical waveguide, but perpendicular to a propagation direction of the optical signal. This electric field shifts a band gap of the germanium, thereby modulating the optical signal.

The electro-absorption modulator on silicon in the optical device operates at low voltage and can be integrated with a silicon optical waveguide on a silicon-on-insulator (SOI) platform. Moreover, the optical device is compatible with CMOS fabrication techniques, including the next-generation drive voltages offered by 40 and 22 nm process nodes. Furthermore, the electro-absorption modulator has: an enhanced extinction ratio, reduced insertion loss and, thus, improved performance. Consequently, the optical device may facilitate silicon-photonic links for use in applications such as wavelength-division multiplexing.

We now describe embodiments of the optical device. This optical device may heterogeneously integrate germanium to silicon on an SOI substrate or platform in a CMOS-compatible foundry to make a Franz-Keldysh (FK) electro-absorption modulator with improved performance. In particular, this optical device may use a combination of a so-called 'butt' architecture and a so-called 'adiabatic' architecture in conjunction with a thicker silicon layer above the buried-oxide layer in the SOI platform (relative to existing approaches), thereby improving the quality of the germanium (e.g., by reducing dislocations associated with lattice mismatch). The use of a thicker silicon layer reduces the optical confinement in the silicon optical waveguide and can result in multi-mode optical guiding, which increases optical losses. To avoid this, the optical device uses a rib optical-waveguide architecture. In advanced CMOS nodes, in which the typical thickness of the silicon layer is around 300 nm, a rib optical-waveguide architecture results in single-mode optical guiding. The use of a rib optical-waveguide architecture also facilitates ohmic contacts so the electric field can be applied across the germanium to produce the FK effect.

The geometry of the active germanium in the optical device (e.g., the height and topology) is selected so that the germanium is fully integrated in a CMOS-compliant process. In particular, the post-growth germanium topology is flat so that the subsequent stack-up layers build the inter-level dielectric steps for CMOS. In addition, the germanium thickness is selected so that there is good confinement and coupling without broadening the absorption edge and lowering the performance of the electro-absorption modulator.

FIG. 1 presents a block diagram illustrating a side view of an optical device 100. This optical device includes an optical waveguide 110, having a top surface 112, which conveys an optical signal having a wavelength along a propagation direction 114. Moreover, optical device 100 includes an electro-absorption modulator 116 disposed on top surface 112.

Figure 2:
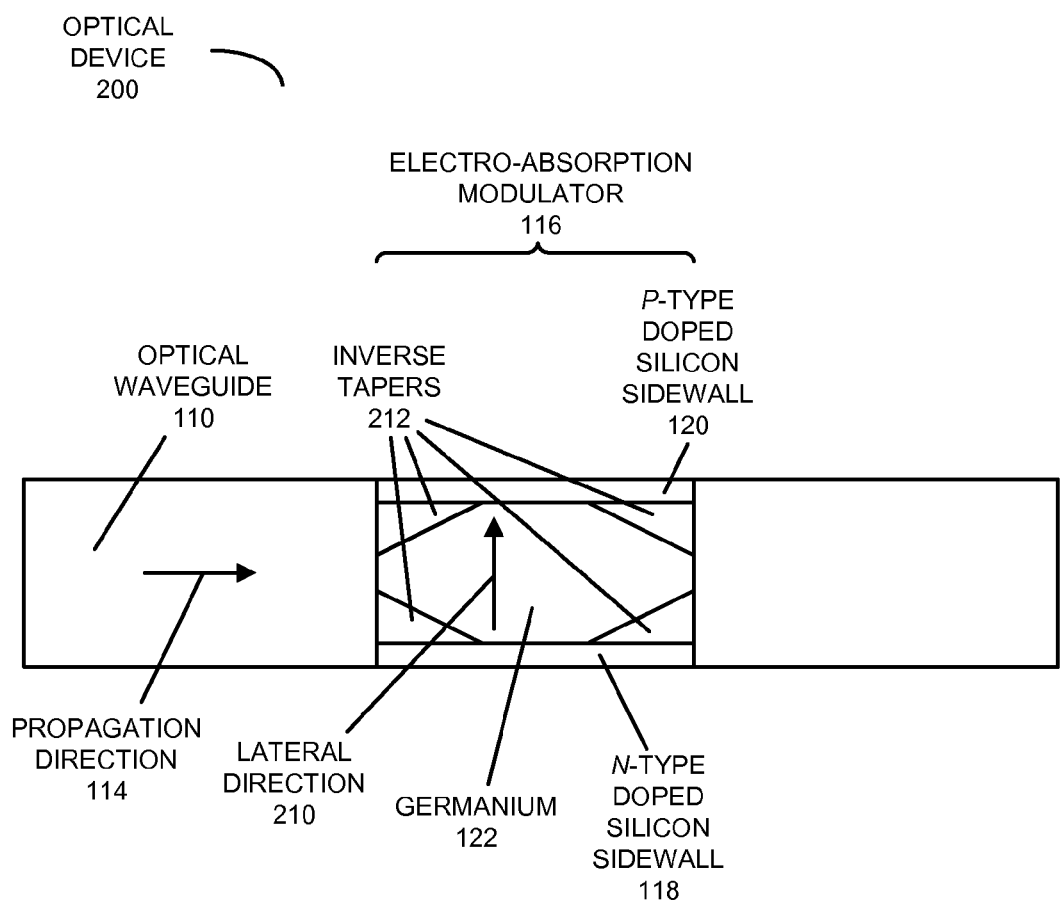
FIG. 2 is a block diagram illustrating a top view of the optical device of FIG. 1 in accordance with an embodiment of the present disclosure.

Electro-absorption modulator 116 includes: an n-type doped silicon sidewall 118; a p-type doped silicon sidewall 120; germanium 122 disposed between n-type doped silicon sidewall 118 and p-type doped silicon sidewall 120; and electrical contacts 124 electrically coupled to n-type doped silicon sidewall 118 and p-type doped silicon sidewall 120. As shown in FIG. 2, which presents a block diagram illustrating a top view of optical device 200, electrical contacts 124 apply a voltage between n-type doped silicon sidewall 118 and p-type doped silicon sidewall 120 to generate an electric field along a lateral direction 210 in germanium 122, where lateral direction 210 is parallel to a plane 126 of optical waveguide 110 and is perpendicular to propagation direction 114. The electric field may shift a band gap of germanium 122 to modulate the optical signal in optical waveguide 110.

Referring back to FIG. 1, n-type doped silicon sidewall 118 and p-type doped silicon sidewall 120 may be included in a ring of silicon. This ring of silicon may include a cavity 128 defined by an edge 130, and germanium 122 may be disposed in cavity 128. Thus, germanium 122 may be disposed in a hole or cavity 128 in optical waveguide 110.

As noted previously, thickness 132 of germanium 122 may be selected to be large enough to reduce dislocations in germanium 122 and to support the optical mode, while not being so large that chemical-mechanical polishing (CMP) cannot be used when fabricating optical device 100. For example, germanium 122 may have thickness 132 between 300 and 600 nm. In general, thickness 132 in this range is CMOS-compliant because foundries often use thin silicon (less than 0.4 μm) on SOI platforms for optical and electronic devices. This thickness 132 range for germanium 122 may offer improved performance in FK electro-absorption modulator 116.

In particular, the germanium deposition may be locally introduced by patterning a hole or cavity 128 in optical waveguide 110. This approach allows thicker germanium deposition that has fewer dislocations in the FK sections, while maintaining a thin silicon thickness for the other optical components. In optical device 100, n-type doped silicon sidewall 118 and p-type doped silicon sidewall 120 present surfaces where dislocation can terminate and, thus, cause additional annihilation mechanisms for dislocation reductions that typically are not present in other designs. Misfit dislocation arrays at the interface with the sidewalls are usually benign (from a dark-current perspective), but can annihilate a bulk-threading dislocation that propagates vertically at a 60° angle from the bottom silicon-germanium epitaxial interface. These treading dislocations may have local internal fields that can broaden the absorption edge or can reduce the impact of the applied electric field on electro-absorption. Moreover, a threading dislocation can only be removed by annihilation with either another thread (in a pair) or by an interface. Such dislocation removal is included in the design of optical device 100 to improve the performance. In addition, the silicon/germanium sidewall surfaces are quasi-passivated in optical device 100; otherwise, germanium oxides form that can be conductive and present dark-current paths.

The sidewall geometry shown in FIG. 1 may also allow the applied electric field to be optimized. Typically, lateral electric fields are achieved using implants of n-type or p-type impurities. These species usually have associated straggle lengths that are hard to control, so the junction in electro-absorption modulator 116 cannot be precisely defined. Furthermore, in regions where the dopants reside, the applied field usually does not develop and germanium 122 has no FK effect. Instead, germanium 122 may absorb and produce loss with a reduced overall relative modulation averaged over the optical mode. In addition, the dopants usually have concentration gradients that are hard to control.

In optical device 100, the sidewalls in the silicon can be doped independently and to produce a well-defined junction independent of germanium 122. For low voltages (less than 2 V), the lateral junction may be ultra-thin and may support a larger internal electric field than an implanted lateral junction solely defined in germanium 122. Thus, in contrast with lateral implantation (in which the dopant straggle can dominate a thin junction width, which may make it difficult to achieve high electric fields), the electric field in germanium 122 may be large, thereby providing FK electro-absorption at low voltages (such as those in advanced CMOS nodes).

Figure 3:
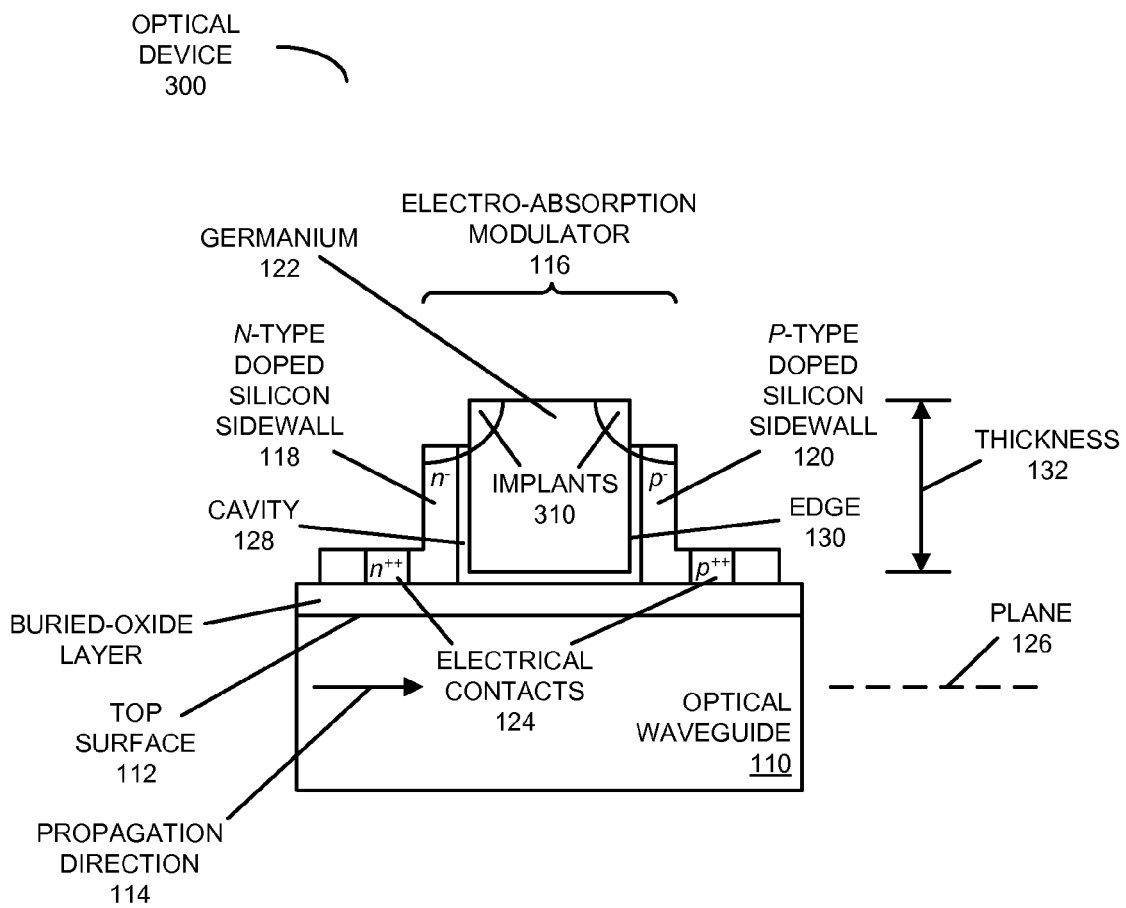
FIG. 3 is a block diagram illustrating a side view of an optical device in accordance with an embodiment of the present disclosure.

The implants in optical device 100 may be performed in a post module after the germanium growth without degrading the sidewall junction defined by the silicon. This is shown in FIG. 3, which presents a block diagram illustrating a side view of an optical device 300. In particular, implants 310 in germanium 122 are used to build a lateral junction device that completes the silicon-defined sidewall junction. The resulting n-i-p junction allows the applied electric field to be optimized in the germanium layer.

In optical device 300, thicker germanium 122 is used to increase the ratio of the change in absorption to the total absorption of electro-absorption modulator 116 by dislocation reduction and improved coupling insertion loss. Note that the n-type and the p-type implants 310 in germanium 122 may occur at the top surface of the germanium module at a CMOS foundry.

Moreover, in optical device 300 the straggle of implants 310 may be less important because the optical mode is tapering off, because the low index of refraction from the surface passivation layer usually repels the optical mode. In typical CMOS modules a tetraethyl orthosilicate (TEOS) layer caps the germanium module. However, the top germanium implants 310 may form a complete germanium junction from the bottom of the silicon above the buried-oxide layer (which is described further below with reference to FIG. 5) to the oxide layer cladding the top of the germanium optical waveguide. Thus, a thicker germanium layer can be used to improve the relative absorption and to minimize insertion loss in the optical device.

In some embodiments, lateral tapers are used to condition the input/output optical mode from the silicon optical waveguide to match the active germanium optical waveguide. These tapers may reduce mode mismatch between the silicon and the germanium optical waveguides, and may also lower the associated insertion loss.

Referring back to FIG. 2, in some embodiments optical device 100 includes inverse optical tapers 212 defined in germanium 122, where inverse optical tapers 212 control a spatial extent of an optical mode in germanium 122. For example, inverse optical tapers 212 may expand optical waveguide 110. Note that inverse optical tapers 212 may include doped or patterned regions in germanium 122.

Figure 4:
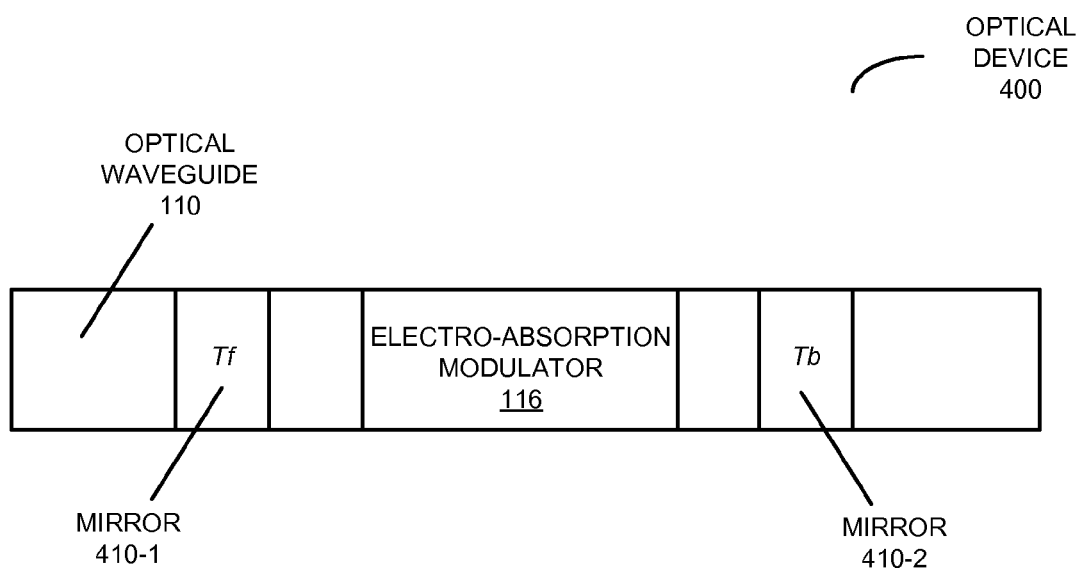
FIG. 4 is a block diagram illustrating a top view of an optical device in accordance with an embodiment of the present disclosure.

In some embodiments, the performance of the FK electro-absorption modulator is improved by resonantly enhancing the electro-absorption of germanium. In these embodiments, the germanium active medium is bounded by minors that enhance the optical field in the germanium. This is shown in FIG. 4, which presents a block diagram illustrating a top view of an optical device 400. In particular, optical waveguide 110 may include minors 410 on either side of electro-absorption modulator 116. For example, mirrors 410 may include distributed Bragg gratings.

Mirrors 410 in silicon optical waveguide 110 on either side of electro-absorption modulator 116 may have transmission coefficients Tf and Tb, respectively, from an incident (front) and reflective (back) mirror. These mirrors may be fabricated in silicon optical waveguide 110 using high and low index-of-refraction contrast elements. For example, air gaps and quarter-wave teeth (such as lateral corrugations along the optical-waveguide edge or vertical top-striations in the optical waveguide) may be etched in the silicon layer above the buried-oxide layer.

The transmission of optical device 400 may be 50% at an applied voltage of 0 V. When 2 V is applied, the transmission may drop close to zero. This may occur when the absorption coefficient times the length of the germanium is such that light from the rear facet is absorbed by the germanium to equal the transmission of the front facet. When this occurs, the two mirrors may produce a null (effectively canceling out transmission) so no light exits device 400. In contrast, when optical device 400 is less absorbing (e.g., at 0 V), the interference null may not develop and the light exits optical device 400.

The resonant enhancement can provide a very large extinction ratio, much larger than that in a single-pass optical device. While the insertion loss may be higher in the resonant geometry, this may be partially offset by a shorter germanium length to reduce that penalty. Moreover, the junction capacitance of optical device 400 may be lower than for a single-pass optical device. Consequently, the modulation power may be reduced.

In some embodiments, the electro-absorption modulator is placed in a laser cavity to effectively quench lasing by increasing differential absorption. By ensuring that the laser cavity has sufficient gain to maintain lasing above threshold even during the 'zero' or high-absorption-state of the electro-absorption modulator, a high-speed switched optical source can be achieved.

Figure 5:
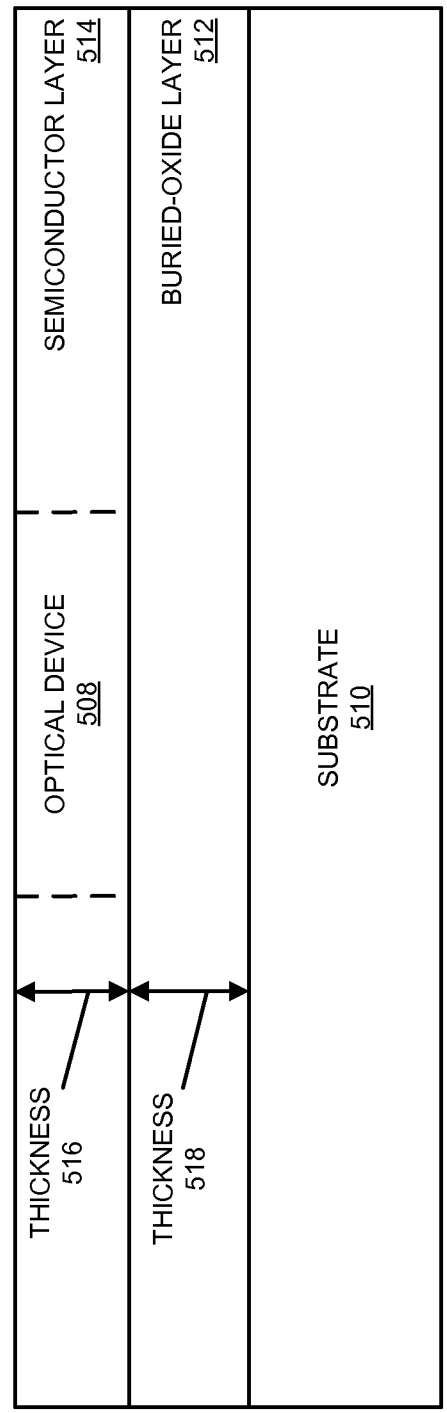
FIG. 5 is a block diagram illustrating a side view of an integrated circuit that includes an optical device in accordance with an embodiment of the present disclosure.

The preceding embodiments of the optical device may, at least in part, be implemented using silicon-on-insulator (SOI) technology. This is shown in FIG. 5, which presents a block diagram illustrating a side view of integrated circuit 500 that includes optical device 508, such as one of the embodiments of the optical device shown in FIGS. 1-4. In particular, integrated circuit 500 may include: a substrate 510; a buried-oxide layer 512 disposed on substrate 510; and a semiconductor layer 514 disposed on buried-oxide layer 512. As illustrated in FIG. 5, optical device 508 may be included in semiconductor layer 514. Note that substrate 510 and/or semiconductor layer 514 may include a semiconductor, such as silicon.

In an exemplary embodiment, the optical signal has one or more wavelengths between 1.1-1.7 μm, such as an optical signal having a fundamental wavelength of 1.3 or 1.55 μm.

Moreover, semiconductor layer 514 may have a thickness 516 that is less than 1 μm (such as 0.25-0.3 μm). Furthermore, buried-oxide layer 512 may have a thickness 518 between 0.3 and 3 μm (such as 0.8 μm).

Figure 6:
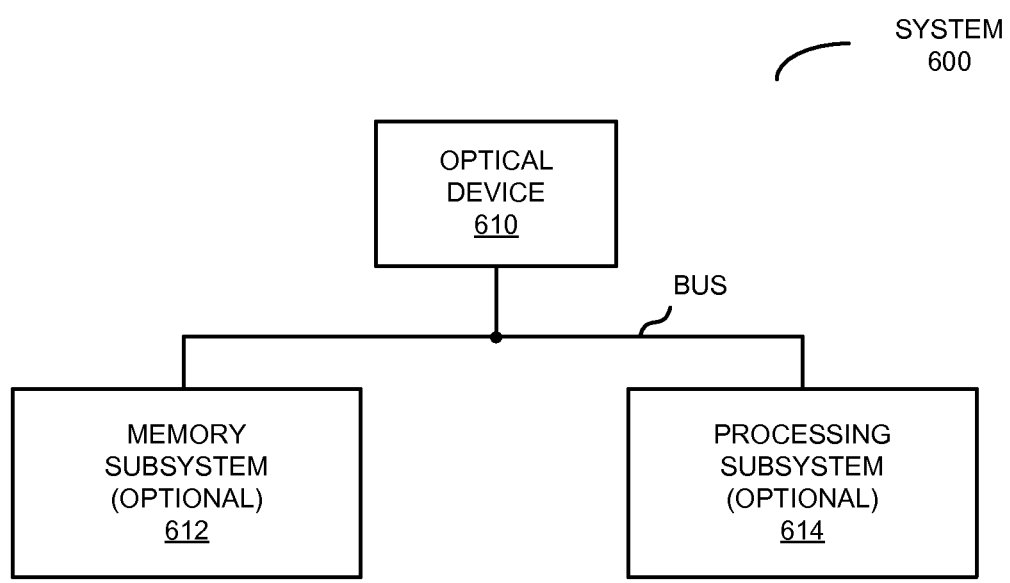
FIG. 6 is a block diagram illustrating a system that includes an optical device in accordance with an embodiment of the present disclosure.

The optical device may be used in a variety of applications. This is shown in FIG. 6, which presents a block diagram illustrating a system 600 that includes optical device 610, which may include one of the embodiments of the optical device shown in FIGS. 1-4.

In general, functions of the optical device and system 600 may be implemented in hardware and/or in software. Thus, system 600 may include one or more program modules or sets of instructions stored in an optional memory subsystem 612 (such as DRAM or another type of volatile or non-volatile computer-readable memory), which may be executed by an optional processing subsystem 614. Note that the one or more computer programs may constitute a computer-program mechanism. Furthermore, instructions in the various modules in optional memory subsystem 612 may be implemented in: a high-level procedural language, an object-oriented programming language, and/or in an assembly or machine language. Note that the programming language may be compiled or interpreted, e.g., configurable or configured, to be executed by the processing subsystem.

Components in system 600 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 600 may be at one location or may be distributed over multiple, geographically dispersed locations.

System 600 may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device. Note that a given computer system may be at one location or may be distributed over multiple, geographically dispersed locations.

Moreover, the optical device can be used in a wide variety of applications, such as: optical communications (for example, in an optical interconnect or an optical link), data storage (such as an optical-storage device or system), medicine (such as a diagnostic technique or surgery), a barcode scanner, and/or metrology (such as precision measurements of distance).

Furthermore, the embodiments of the optical device, the integrated circuit and/or the system may include fewer components or additional components. Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the optical device, the integrated circuit and/or the system may be implemented more in hardware and less in software, or less in hardware and more in software, as is known in the art.

While a silicon optical waveguide and a germanium photo-absorption modulator were illustrated in the preceding embodiments, the modulation technique may be used with other materials (such as silicon germanium), as is known to one of skill in the art.

Figure 7:
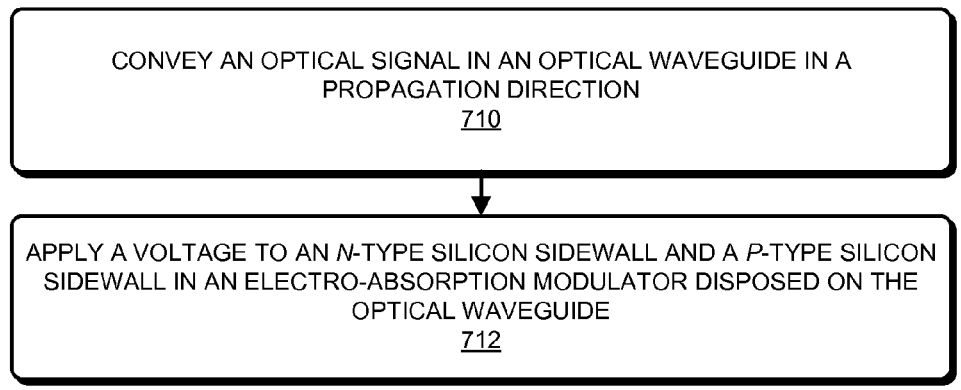
FIG. 7 is a flow chart illustrating a method for modulating an optical signal into an electrical signal in accordance with an embodiment of the present disclosure.

We now describe embodiments of the method. FIG. 7 presents a flow chart illustrating a method 700 for modulating an optical signal, which may be performed by one of the embodiments of the optical device in FIGS. 1-4. During operation, the optical device conveys an optical signal in an optical waveguide in a propagation direction (operation 710). Then, the optical device applies a voltage to an n-type doped silicon sidewall and a p-type doped silicon sidewall in an electro-absorption modulator disposed on top of the optical waveguide (operation 712), where the voltage generates a lateral electric field in germanium between the n-type doped silicon sidewall and the p-type doped silicon sidewall. Note that the lateral electric field is parallel to a plane of the optical waveguide and is perpendicular to the propagation direction.

In some embodiments of method 700, there are additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical device, comprising:
an optical waveguide, having a top surface, configured to convey an optical signal having a wavelength along a propagation direction; and
an electro-absorption modulator disposed on the top surface, wherein the electro-absorption modulator includes:
an n-type doped silicon sidewall;
a p-type doped silicon sidewall;
germanium disposed between the n-type doped silicon sidewall and the p-type doped silicon sidewall; and
electrical contacts electrically coupled to the n-type doped silicon sidewall and the p-type doped silicon sidewall, wherein the electrical contacts are configured to apply a voltage between the n-type doped silicon sidewall and the p-type doped silicon sidewall to generate an electric field along a lateral direction in the germanium, and
wherein the lateral direction is parallel to a plane of the optical waveguide and is perpendicular to the propagation direction.

2. The optical device of claim 1, wherein the n-type doped silicon sidewall and the p-type doped silicon sidewall are included in a ring of silicon;
wherein the ring of silicon includes a cavity defined by an edge; and
wherein the germanium is disposed in the cavity.

3. The optical device of claim 1, wherein the optical device further includes inverse optical tapers defined in the germanium; and
wherein the inverse optical tapers are configured to control a spatial extent of an optical mode in the germanium.

4. The optical device of claim 3, wherein the inverse optical tapers include doped regions in the germanium.

5. The optical device of claim 1, wherein the germanium has a thickness between 300 and 600 nm.

6. The optical device of claim 1, wherein the optical waveguide further includes minors on either side of the electro-absorption modulator.

7. The optical device of claim 6, wherein the mirrors include distributed Bragg gratings.

8. The optical device of claim 1, further comprising:
a substrate;
a buried-oxide layer disposed on the substrate; and
a semiconductor layer disposed on the buried-oxide layer, wherein the optical waveguide is included in the semiconductor layer.

9. The optical device of claim 8, wherein the substrate includes a semiconductor.

10. The optical device of claim 8, wherein the substrate, the buried-oxide layer and the semiconductor layer comprise a silicon-on-insulator technology.

11. A system, comprising:
a processor;
a memory storing a program module that is configured to be executed by the processor; and
an optical device, wherein the optical device includes:
an optical waveguide, having a top surface, configured to convey an optical signal having a wavelength; and
an electro-absorption modulator disposed on the top surface, wherein the electro-absorption modulator includes:
an n-type doped silicon sidewall;
a p-type doped silicon sidewall;
germanium disposed between the n-type doped silicon sidewall and the p-type doped silicon sidewall; and
electrical contacts electrically coupled to the n-type doped silicon sidewall and the p-type doped silicon sidewall, wherein the electrical contacts are configured to apply a voltage between the n-type doped silicon sidewall and the p-type doped silicon sidewall to generate an electric field along a lateral direction in the germanium, and
wherein the lateral direction is parallel to a plane of the optical waveguide and is perpendicular to the propagation direction.

12. The system of claim 11, wherein the n-type doped silicon sidewall and the p-type doped silicon sidewall are included in a ring of silicon;
wherein the ring of silicon includes a cavity defined by an edge; and
wherein the germanium is disposed in the cavity.

13. The system of claim 11, wherein the optical device further includes inverse optical tapers defined in the germanium; and
wherein the inverse optical tapers are configured to control a spatial extent of an optical mode in the germanium.

14. The system of claim 13, wherein the inverse optical tapers include doped regions in the germanium.

15. The system of claim 11, wherein the germanium has a thickness between 300 and 600 nm.

16. The system of claim 11, wherein the optical waveguide further includes minors on either side of the electro-absorption modulator.

17. The system of claim 16, wherein the mirrors include distributed Bragg gratings.

18. The system of claim 11, further comprising:
a substrate;
a buried-oxide layer disposed on the substrate; and
a semiconductor layer disposed on the buried-oxide layer, wherein the optical waveguide is included in the semiconductor layer.

19. The system of claim 18, wherein the substrate, the buried-oxide layer and the semiconductor layer comprise a silicon-on-insulator technology.

* * * * *

UNITED STATES PATENT AND TRADEMARK OFFICE
CERTIFICATE OF CORRECTION

| | | |
|---|---|---|
| PATENT NO. | : 9,142,698 B1 | Page 1 of 1 |
| APPLICATION NO. | : 14/252607 | |
| DATED | : September 22, 2015 | |
| INVENTOR(S) | : Cunningham et al. | |

It is certified that error appears in the above-identified patent and that said Letters Patent is hereby corrected as shown below:

In the specification

Column 6, line 9, delete "minors" and insert -- mirrors --, therefor.

Column 6, line 13, delete "minors" and insert -- mirrors --, therefor.

In the claims

Column 9, line 41, claim 6, delete "minors" and insert -- mirrors --, therefor.

Column 10, line 41, claim 16, delete "minors" and insert -- mirrors --, therefor.

Signed and Sealed this
Thirty-first Day of May, 2016

Michelle K. Lee
*Director of the United States Patent and Trademark Office*